United States Patent [19]

Tanaka et al.

[11] Patent Number: 4,562,549
[45] Date of Patent: Dec. 31, 1985

[54] DIGITAL PLAYER USING A PULSE WIDTH DETECTOR

[75] Inventors: Hiromichi Tanaka; Hiroyuki Kimura; Tsutomu Noda; Takao Arai; Masaharu Kobayashi, all of Yokohama; Shigeki Inoue, Toyokawa, all of Japan

[73] Assignee: Hitachi, Ltd., Tokyo, Japan

[21] Appl. No.: 434,058

[22] Filed: Oct. 13, 1982

[30] Foreign Application Priority Data

Oct. 14, 1981 [JP] Japan .................. 56-162834
Feb. 22, 1982 [JP] Japan .................. 57-26010
May 26, 1982 [JP] Japan .................. 57-87929

[51] Int. Cl.⁴ .......................... H03K 5/01; H03K 5/22
[52] U.S. Cl. .................... 364/486; 307/268; 307/265; 307/234; 318/312; 358/322; 358/338; 360/74.4
[58] Field of Search ............. 364/486, 487; 307/234, 307/265, 266, 267, 268; 328/69, 72, 73, 108, 109, 111, 129.1; 329/104, 105, 106; 324/166, 172, 173; 375/21, 22; 360/74.4, 73; 318/310, 311, 312; 358/321, 322, 338, 339

[56] References Cited

U.S. PATENT DOCUMENTS

| | | | |
|---|---|---|---|
| 3,940,556 | 2/1976 | Boltz, Jr. | 358/338 |
| 4,321,632 | 3/1982 | Leis et al. | 360/74.4 |
| 4,393,420 | 7/1983 | Tomizawu | 360/73 |
| 4,423,498 | 12/1983 | Kimura et al. | 358/322 |
| 4,449,061 | 5/1984 | Yasuda et al. | 307/265 |

Primary Examiner—John W. Caldwell, Sr.
Assistant Examiner—Donna Ansetti
Attorney, Agent, or Firm—Antonelli, Terry & Wands

[57] ABSTRACT

In a pulse width detector circuit, a high-level pulse width and a low-level pulse width of a digital signal derived by slicing an analog signal reproduced from a disc at a predetermined level are independently measured and maximum or minimum values thereof in a predetermined time interval are stored, and an average value, sum or difference of the maximum or minimum high-level pulse width and the maximum or minimum low-level pulse width is calculated to detect a correct pulse width of original data recorded on the disc.

25 Claims, 30 Drawing Figures

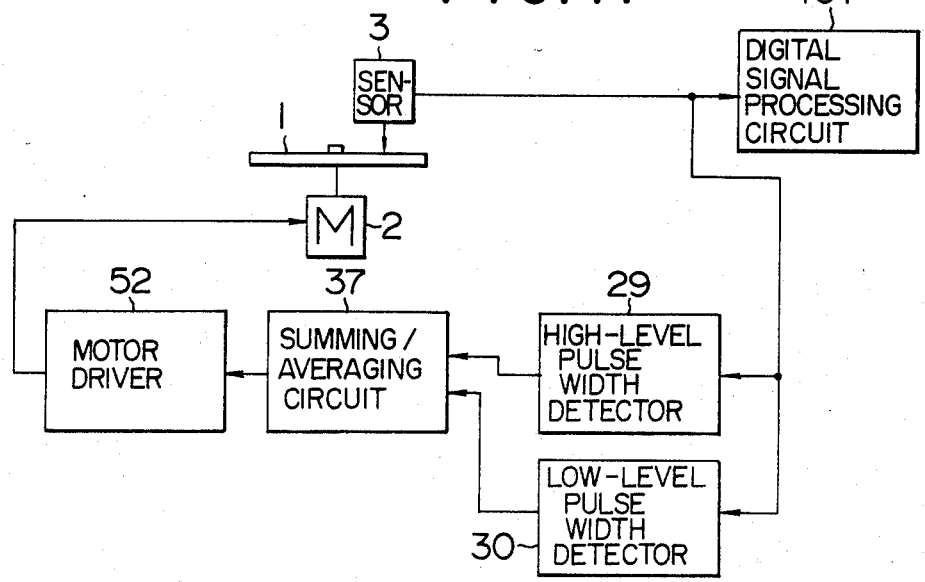
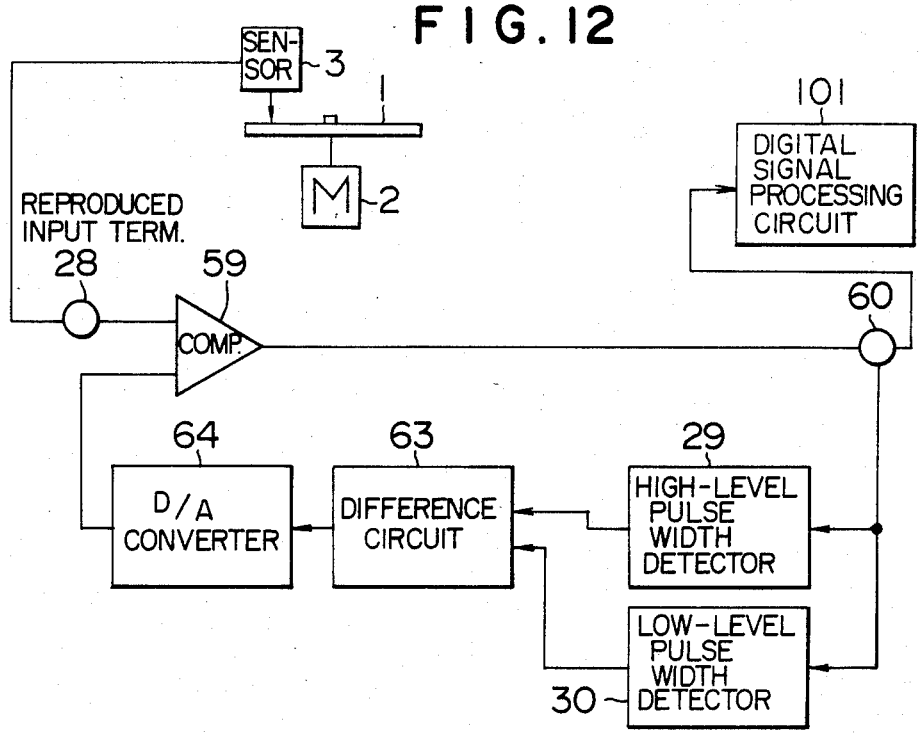

DIGITAL PLAYER USING A PULSE WIDTH DETECTOR

BACKGROUND OF THE INVENTION

The present invention relates to a pulse width detector for detecting the pulse width of a digital signal reproduced from a recording medium and a digital player using the detector.

FIG. 1 shows a motor drive system of a digital audio disc player. Numeral 1 denotes a disc, numeral 2 denotes a disc drive motor, numeral 3 denotes a pickup (sensor) for picking up a signal from the disc, and numeral 4 denotes a synchronizing signal detector for detecting a synchronizing signal from the signal reproduced from the disc. Since the synchronizing signal is recorded on the disc at a constant period, it is an indicator of rotational speed. The frequency of the synchronizing signal is converted to a voltage by a frequency-to-voltage converter 5, which voltage is then fed back to the motor 2 to form a servo loop.

The signal on the disc 1 comprises a series of pulses as shown in FIG. 2. The width of each pulse is an integral multiple of a basic period T. Numeral 6 denotes a specific pattern in the pulse sequence, which has a combination of high-level and low-level pulse widths of 11T. It is the synchronizing signal distinguished from other information signals. The pulse width of 11T is a maximum pulse width of all pulse widths.

By utilizing a synchronizing signal having the pulse width of 11T—11T as a velocity signal, a velocity control of the disc motor can be attained. However, the synchronizing signal is obtained only during a steady rotation state, and the pulse width of 11T cannot be obtained at the time of start of the motor because it is rotated at a low rotational speed. As a result, it is not possible to detect the rotational speed under these starting conditions. A method for effecting velocity control at the time of starting of the motor using the output signal of a frequency-to-voltage converter has been proposed.

An alternative method is disclosed in a copending U.S. application Ser. No. 311,048 filed Oct. 13, 1981 entitled "CLOCK RATE DETECTOR" and assigned to the present assignee, which issued as U.S. Pat. No. 4,423,498 on Dec. 27, 1983. In the alternative method, a pulse having a maximum width is detected from randomly detected pulses having various pulse widths. It corresponds to the pulse width 11T in the steady state. The velocity is predicted from the maximum pulse width. That is, an error in the pulse width of 11T is detected.

The signal detected from the disc is close to an analog signal at an early state of the rotation and it is converted to a digital signal by slicing it at a predetermined level. The reproduced signal is shown by 7 in FIG. 3. Numerals 8, 9 and 10 denote slicing levels for the digital conversion. When the slicing level is near a center of an amplitude (peak-to-peak) of the reproduced signal 7 as shown by the level 9, the duty factor of the digital-converted pulse waveform is approximately 50% so that the pulse widths of 11T are obtained. However, when the slicing level is shifted upward or downward as shown by the levels 8 and 10, the duty factor is not 50% and the pulse widths of 11T are not exactly obtained.

When the reproduced waveform is not vertically balanced as shown in FIG. 4, the exact pulse widths of 11T are also not obtained. In FIG. 4, the pulse widths of 11T are obtained from a waveform 15 but the exact pulse widths of 11T are not obtained from the reproduced waveforms 14 and 16 because of vertical unbalance.

When the start control for the disc is to be effected in accordance with the pulse width of the digital pulse, the motor cannot be controlled from the start of rotation to steady rotation unless the exact pulse width is obtained. Accordingly the detection of the exact pulse width is essential.

If an amplitude variation or a bias variation is included in a binary "1" and "0" input signal of the digital signal reproduced from the disc, data is not correctly discriminated when the level of the input signal varies with a constant level of threshold voltage. Accordingly, in a prior art binary signal data discriminator, a peak and a bottom of the input signal are detected so that the level at a mid-point thereof is compared to exactly discriminate the data.

FIG. 5 shows waveforms for explaining the operation of the prior art circuit. Numeral 21 denotes an input waveform, numeral 22 denotes the level at a mid-point of the peak and the bottom of the input waveform 21, and numeral 23 denotes a digital signal derived by voltage comparison of the input waveform 21 at the mid-point level 22. Under this condition, even if a D.C. bias variation or an amplitude variation at a sufficiently low frequency to the input waveform 21 is included, the digital signal 23 is not influenced. However, if a vertically asymmetric waveform distortion is included as shown by the input waveform 24 of FIG. 6, the mid-point level is changed to a level 25 and a digital signal 26 which is different from a desired digital signal 27 is produced. As a result, the data cannot be exactly discriminated. See, for example, Japanese Patent Laid-Open Nos. 55-150644 and 55-150645.

SUMMARY OF THE INVENTION

It is, therefore, an object of the present invention to provide a pulse width detector which can detect a correct pulse width of original data from a signal sequence reproduced from a disc even in the case of a disturbance of the duty factor of the waveform of an analog signal prior to analog-to-digital conversion.

In accordance with one aspect of the present invention, high-level pulse widths and low-level pulse widths of a digital signal derived by slicing an analog signal reproduced from a recording disc at a predetermined slicing level are independently detected, and maximum (or minimum) pulse widths in a given time interval are stored, and an average (or sum or difference) of the high-level and low-level maximum pulse widths is calculated to obtain a correct pulse width of original data. In another aspect of the present invention, the time interval from the rise of a pulse to the rise of the next pulse or from the fall of a pulse to the fall of the next pulse is detected to obtain the correct pulse width.

BRIEF DESCRIPTION OF THE DRAWINGS

The object, features and advantages of the present invention will be apparent from the following detailed description of the preferred embodiments taken in conjunction with the accompanying drawings, in which:

FIG. 11 shows a configuration of a motor servo system which utilizes the pulse width detector of the present invention, FIG. 12 shows a configuration of a data discriminator which utilizes the pulse width detector of the present invention.

FIG. 7 shows one embodiment of the present invention. Numeral 60 denotes an input terminal which receives a digital (sequence) signal derived by slicing an analog signal reproduced from a disc at a predetermined level, numeral 29 denotes a high-level pulse width detector, numeral 30 denotes a low-level pulse width detector, numeral 37 denotes an arithmetic operation circuit, and numerals 32a and 32b denote counters which count clock signals supplied from a control circuit 39. The clock signals preferably have a pulse rate sufficiently faster than the pulse rate of pulses to be measured or detected and they are a factor of accuracy of pulse width to be measured. Since the digital signal terminal 60 is connected to a counter enable terminal of the counter 32b, the counter 32b counts up when the digital input signal is at a high level. Since an enable terminal of the counter 32a is connected to the digital input signal terminal 60 through an inverter 31, the counter 32a counts up when the digital input signal is at a low level.

Figure 1:
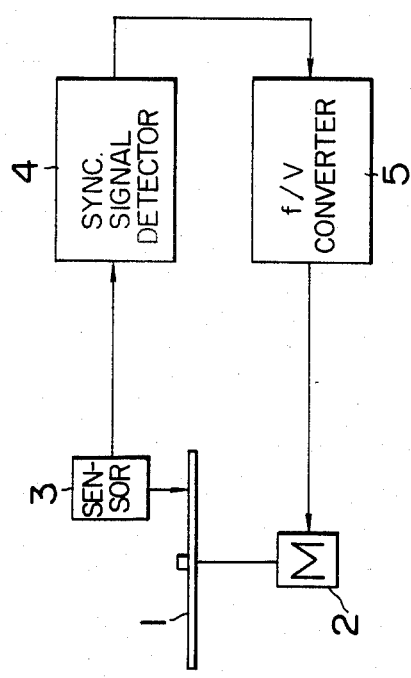
FIG. 1 shows a block diagram of a motor drive system of a digital audio disc player.
Figure 2:
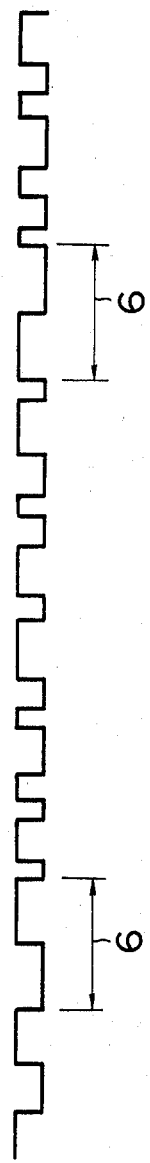
FIG. 2 shows a reproduced digital signal waveform.

Output data from the counters 32a and 32b are supplied to latches 33a and 33b, respectively. When the enable signals of the counters 32a and 32b are at the low level, the latches 33a and 33b latch the output data of the counters 32a and 32b, respectively. Immediately thereafter the counters 32a and 32b are cleared by a clear signal from the control circuit 39. The output of the latch 33a is supplied to an input terminal of a latch 34a and one input terminal of a comparator 36a. The output data of the latch 34a is supplied to the other input terminal of the comparator 36a. The comparator 36a compares the output data of the latch 33a and the latch 34a, and when the data of the latch 33a is larger than the data of the latch 34a, a high-level signal is produced at a terminal B>A of the comparator 36a so that the clock signals are supplied to the latch 34a through an AND circuit 35a in synchronism with the clock signals from the control circuit 39. Thus, the data of the latch 33a is transferred to the latch 34a. When a new data is then supplied from the latch 33a, the comparator 36a again operates to determine whether the clock signal is to be supplied to the latch 34a. Through a sequence of operations described above, the latch 34a latches a maximum pulse-width low-level data. The counter 32b, latches 33b and 34b and the comparator 36b in a left half of FIG. 7 operate in the same manner. The content of the data of the latch in the right half represents the low-level pulse width data of the digital input signal and the content of the data of the latch in the left half represents the high-level pulse width data of the digital input signal.

The outputs of the latches 34a and 34b are supplied to an averaging circuit 37 which is an example of an arithmetic operation circuit, and the output data thereof is supplied to a latch 38. The latch 38 latches periodically, and when it latches, the latches 34a and 34b are cleared and the maximum pulse width detection is resumed from that moment.

The output of the latch 38 is supplied to a pulse width output terminal 40. Referring to the level 9 in FIG. 3, when a high-level maximum pulse width is 9T and a low-level maximum width is 13T, an average of 11T is produced from the terminal 40.

Figure 3:
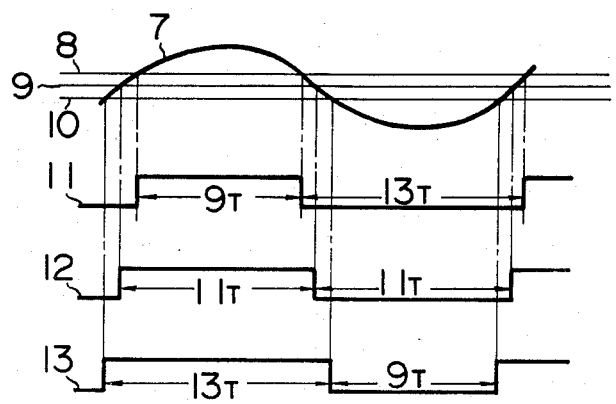
FIGS. 3 to 6 show waveforms of different examples reproduced signals and converted digital signals.
Figure 4:
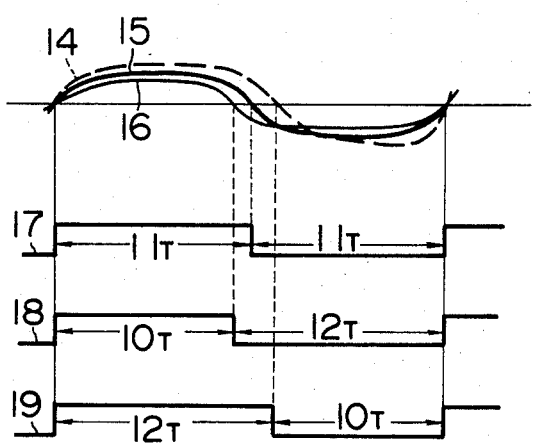
Figure 5:
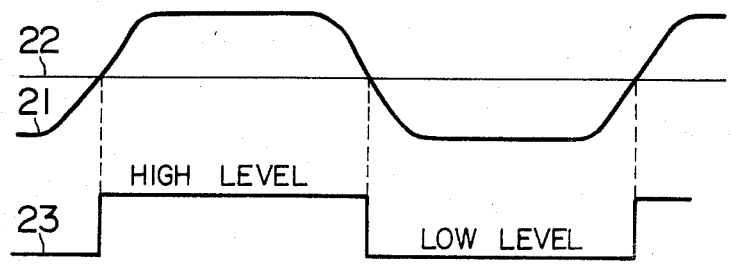

It is important to note that the sum of the high-level pulse width and the low-level pulse width is constant (see FIGS. 3 and 4). The high-level pulse and the low-level pulse are detected independently in order to measure the pulse width of 11T (the pulse width being longer than 11T at a start time) included in the information pulse train other than the synchronizing signal to enhance the accuracy of the measurement.

Figure 7:
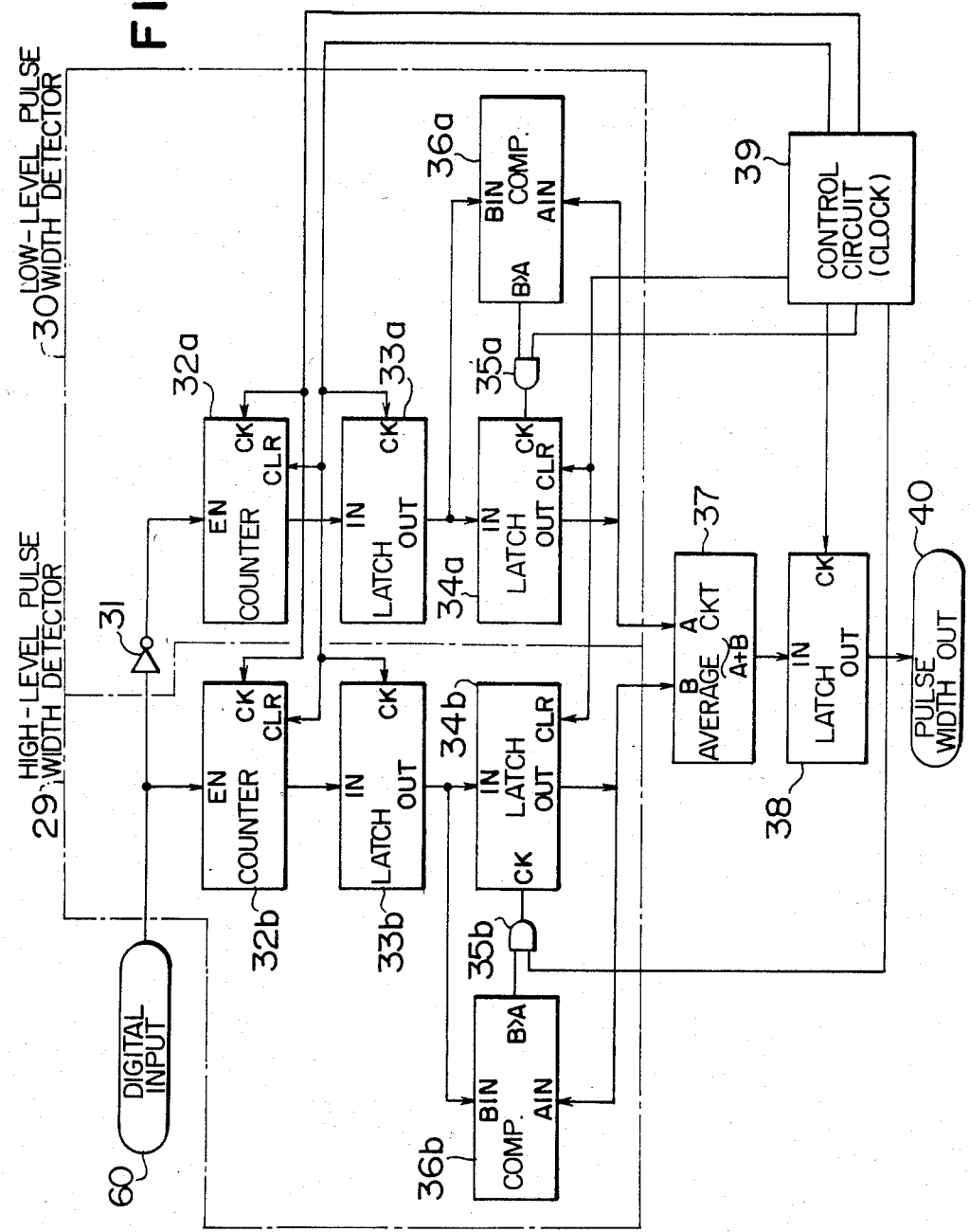
FIG. 7 shows a circuit diagram of one embodiment of a pulse width detector of the present invention.

In the embodiment of FIG. 7, an averaging circuit 37 is used as the arithmetic operation circuit. In this case, a reference for the correct synchronizing signal is 11T. When a difference circuit is used as the arithmetic operation circuit 37, the reference is 0T. When a summing circuit is used as the arithmetic operation circuit 37, the reference is 22T. In this case, it is equivalent to the measurement from a rise to a fall or from the fall to the rise of the pulse.

Figure 8:
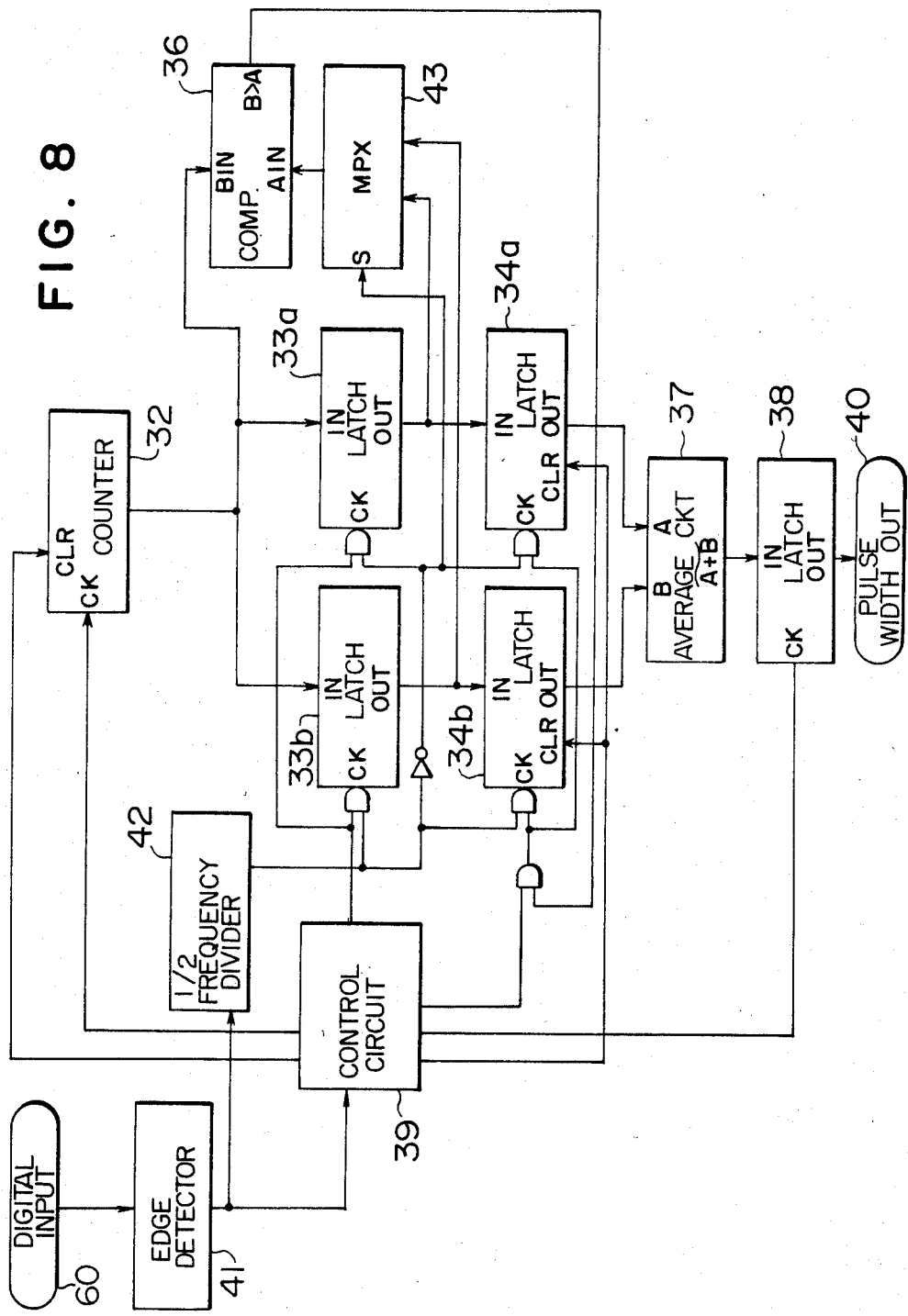
FIG. 8 shows a circuit diagram of a second embodiment.

FIG. 8 shows a second embodiment of the present invention which is an improvement over the embodiment of FIG. 7. In the present embodiment, the counters and the comparators are combined into a single channel. To this end, a counter 32 counts both the high-level pulse width and the low-level pulse width. The selection of counting is effected by an edge detector 41 and a ½ frequency divider 42. The output of the ½ frequency divider 42 which is reversed by an edge signal controls the latches 33a and 33b and the latches 34a and 34b to activate them in the high-level measurement and the low-level measurement, respectively. The output of the ½ frequency divider 42 also controls a multiplexer 43 to select the input data to a comparator 36.

The reference pulse width of 11T, for example, is for the steady rotation state, and a longer pulse width is detected in the start time of the disc. It is thus possible to detect the rotational speed of the disc directly by the pulse width rather than by the period of the synchronizing signal.

In other embodiments, a time interval from the rise of a pulse to the rise of the next pulse or from the fall of a pulse to the fall of the next pulse is detected as the pulse width.

Figure 9:
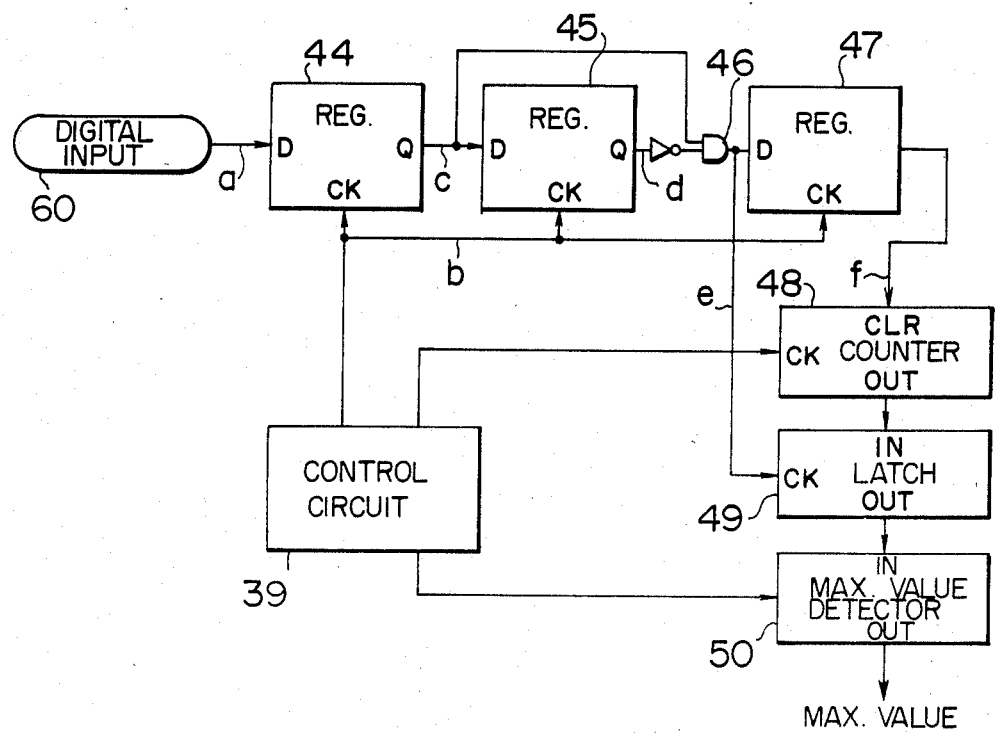
FIG. 9 shows a circuit diagram of a third embodiment.
Figure 10:
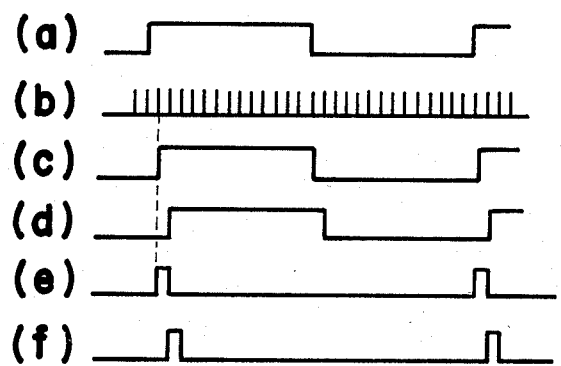
FIG. 10 shows operational signal waveforms of the circuit of FIG. 9.

FIG. 9 shows a circuit diagram therefor and FIG. 10 shows operational signal waveforms. A signal a at a digital signal input terminal 60 is shifted by registers 44 and 45 which latch in response to a clock signal b, and a rising edge signal e of the input signal at terminal 60 is supplied from an AND gate 46. The output data of a counter 48 is latched into a latch 49 by the edge signal e. The edge signal e is delayed by one clock cycle by a register 47 and the output signal f from the register 47 clears the counter 48. The data output of the latch 49 is supplied to a maximum value detector 50 (which is identical to that shown in FIG. 7 or 8) which produces a maximum value in a time period specified by a control circuit 39.

A period of the output data of the maximum value detector 50 corresponds to one period of the high- and low-level pulses and the content thereof corresponds to the pulse width of 11T in the steady rotation state. Thus, whatever the rotational speed of the disc may be, the pulse corresponding to the synchronizing signal is produced as the maximum value at that moment.

Thus, in accordance with the present invention, the inexact measurement of the pulse width due to an unbalance of high- and low-levels of the signal waveform reproduced from the disc and an unbalance of a duty factor of the waveform caused by an improper slicing level in the slicing circuit to convert the reproduced signal to a digital signal, is avoided.

Since the circuit measures the maximum pulse width including the information signal, it can detect the rotational speed of the disc by a pulse width measurement even when the detection of the synchronizing signal period is impossible, such as during the starting time of the disc rotation. Thus, the disc rotational speed can be detected exactly over a wider range than is possible by the conventional disc rotational speed detection using the synchronizing signal.

FIG. 11 shows a configuration of a motor servo circuit which utilizes the pulse width detector of the present invention. Numeral 1 denotes a disc, numeral 2 denotes a disc drive motor, numeral 3 denotes a pickup for picking up a signal from the disc 1, numeral 101 denotes a digital signal processing circuit and numeral 52 denotes a motor drive circuit. In FIG. 11, the pulse width detector comprises a high-level pulse width detector 29, a low-level pulse width detector 30 and a summing or averaging circuit 37, specific circuits of which have been shown in FIGS. 7 to 9. The high-level pulse width data from the high-level pulse width detector 29 and the low-level pulse width data from the low-level pulse width detector 30 are added in the summing or averaging circuit 37. A velocity signal derived from the pulse width is supplied to the motor 2 through the motor drive circuit 52 to control the rotational speed of the motor 2.

When the rotational speed of the disc 1 varies, the pulse width of the resulting signal varies. Thus, the pulse width of the resulting signal represents the rotational speed of the disc 1. When the pulse signal includes an amplitude variation, a bias variation or a waveform distortion, the pulse width which exactly represents the rotational speed is not obtained by the pulse width detection of only the high-level pulse or low-level pulse. The sum of the high-level pulse width and the low-level pulse width corresponds to one cycle period of the high-level and low-level pulses so that the pulse width corresponding to the rotational speed can be detected at a high accuracy. The same effect is obtained when the pulse width is detected by detecting a maximum value, a minimum value or the synchronizing signal.

FIG. 12 shows the configuration of a data discrimination circuit which utilizes the pulse width detector of the present invention. Numeral 28 denotes an input terminal, numeral 59 denotes a voltage comparator, numeral 60 denotes a digital signal input terminal, numeral 29 denotes a high-level pulse width detector for the digital signal, numeral 30 denotes a low-level pulse width detector for the digital signal, numeral 63 denotes a difference circuit for producing a difference between the outputs of the detectors 29 and 30, numeral 64 denotes a digital-to-analog converter and numeral 101 denotes a digital signal processing circuit.

Figure 6:
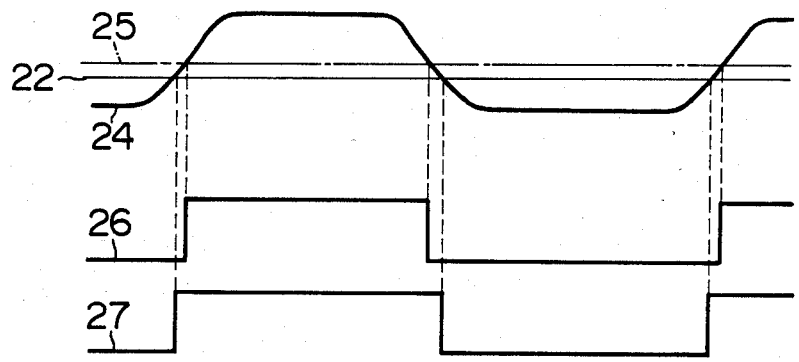
Figure 13:
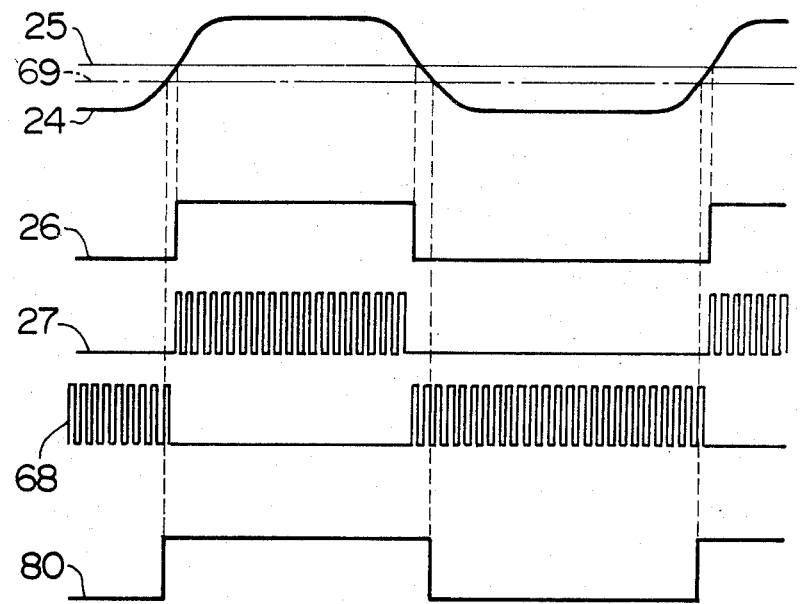
FIG. 13 shows waveforms for explaining the operation of the circuit of FIG. 12, FIGS. 14 and 15 show waveforms for explaining the advantage of the present invention.

The operation of the present embodiment is now explained with reference to FIG. 13. The like numerals to those shown in FIG. 6 denote like waveforms. The input waveform 24 applied to the input terminal 28 is compared with the level 25 by the voltage comparator to produce the digital signal 26. The high-level pulse width detector 29 opens its gate only during a high-level period of the digital signal to count the clock pulses to detect the high-level pulse width as shown by the pulse train 27 and the low-level pulse width detector 30 opens its gate only during a low-level period of the digital signal to count the clock signals to detect the low-level pulse width as shown by the pulse train 68. The difference between the counts of the detectors 29 and 30 is calculated by the difference (subtraction) circuit 63 and the digital-to-analog converter 64 produces an analog voltage corresponding to the output of the difference circuit 63. The output of the converter 64 is fed back as a compare voltage of the voltage comparator 59. As a result, the compare voltage assumes a level 69 such that the high-level pulse duration and the low-level pulse duration of the digital signal are equal, and the digital signal output assumes a level 80. The digital signal output is taken out of the output terminal 60 and used in the digital signal processing by the digital signal processing circuit 101. In order to transfer the data of a low error rate to the digital signal processing circuit 101, the feedback as described above is effected.

In the embodiment of FIG. 12, the difference between the high-level pulse width and the low-level pulse width is used to control the circuit in order to attain a correct operation even when a data transmission rate is different from an intended transmission rate.

Figure 16:
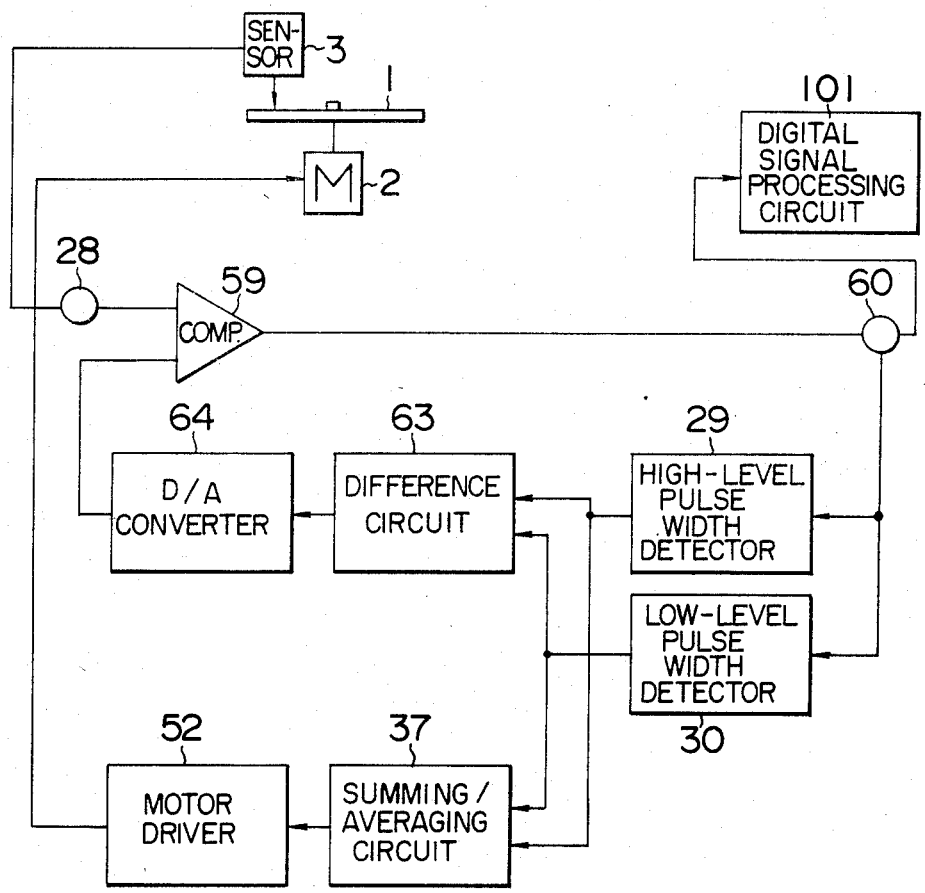
FIG. 16 shows a configuration of a motor servo system and a data discriminator which utilize the pulse width detector of the present invention.

FIG. 16 shows an embodiment in which a motor servo system and a data slicing circuit share the same pulse width detector. It is a combination of FIGS. 11 and 12. The like numeral to those shown in FIGS. 11 and 12 denote like elements. It should be noted that the high-level pulse width detector 29 and the low-level pulse width detector 30 are common and the arithmetic operation circuit comprises the summing or averaging circuit 37 for the motor servo system and the difference circuit 63 for the data discriminator.

Figure 17:
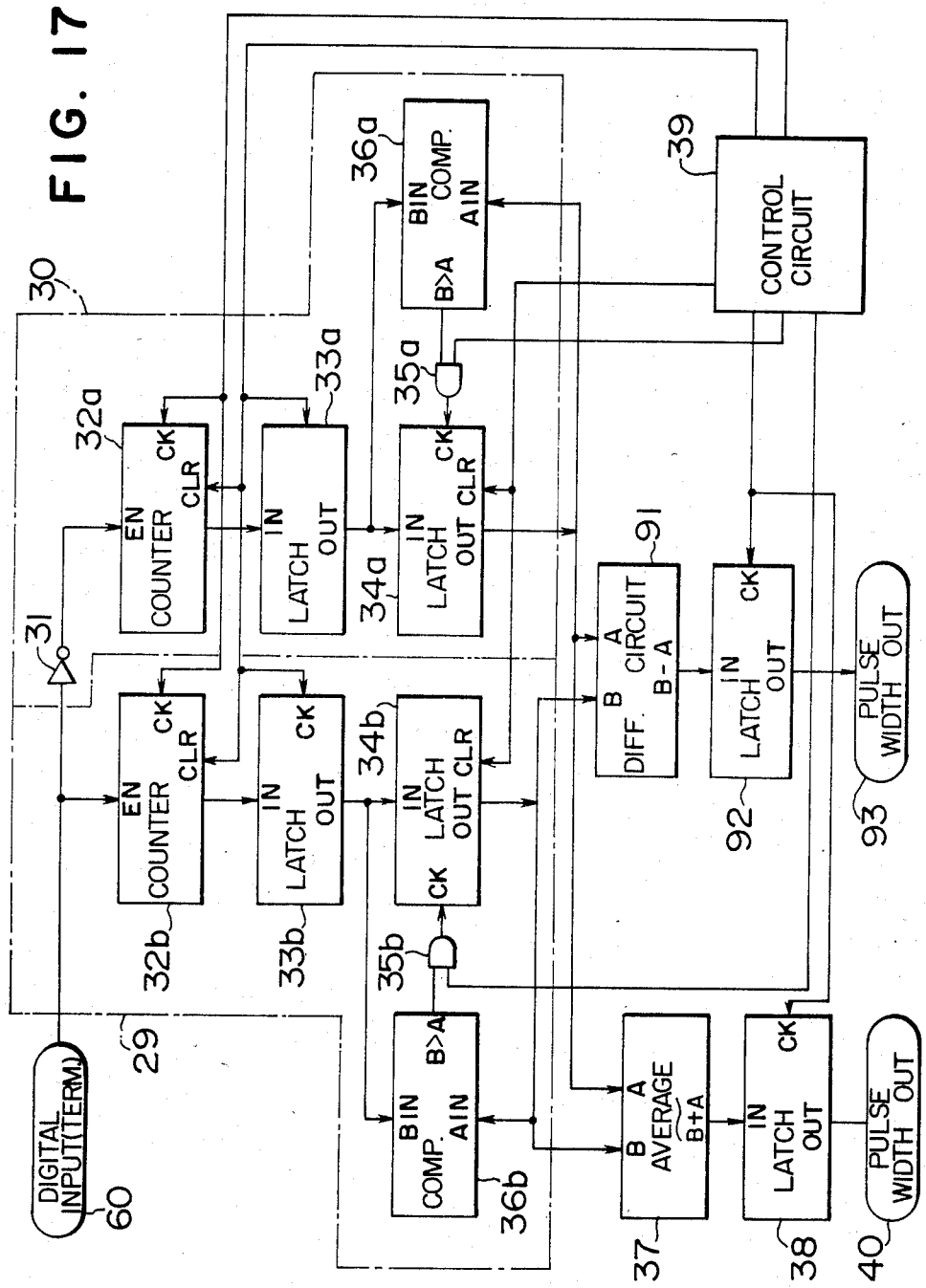
FIG. 17 shows a circuit diagram of the pulse width detector of FIG. 16.

FIG. 17 shows a specific embodiment of the pulse width detector in which a difference (subtraction) circuit 91, a latch 92 and an output terminal 93 are added to the configuration of FIG. 7.

In FIG. 17, numeral 60 denotes an input terminal of a digital signal derived by slicing an analog signal reproduced from the disc at a predetermined level. Numerals 32a and 32b denote counters which count clock signals supplied from a control circuit 39. The clock signals preferably have a pulse rate sufficiently faster than the pulse rate of the pulses to be measured and they are a factor in the accuracy of the pulse width to be measured. Since the digital signal terminal 60 is connected to a counter enable terminal of the counter 32b, the counter 32b counts up when the digital input signal is at a high level. Since an enable terminal of the counter 32a is connected to the digital input signal terminal 60 through an inverter 31, the counter 32a counts up when the digital input signal is at a low level.

Output data from the counters 32a and 32b are supplied to latches 33a and 33b, respectively. When the enable signals of the counters 32a and 32b are at the low level, the latches 33a and 33b latch the output data of the counters 32a and 32b, respectively. Immediately thereafter, the counters 32a and 32b are cleared by a clear signal from the control circuit 39. The output of the latch 33a is supplied to an input terminal of a latch 34a and one input terminal of a comparator 36a. The output data of the latch 34a is supplied to the other input terminal of the comparator 36a. The comparator 36a compares the output data of the latch 33a and the latch 34a, and when the data of the latch 33a is larger than the data of the latch 34a, a high level signal is produced at a terminal B>A of the comparator 36a so that the clock signals are supplied to the latch 34a through an AND circuit 35a in synchronism with the clock signals from the control circuit 39. Thus, the data of the latch 33a is transferred to the latch 34a. When new data is then supplied from the latch 33a, the comparator 36a again operates to determine whether the clock signal is to be supplied to the latch 34a. Through a sequence of operations described above, the latch 34a latches the maximum data. The counter 32b, latches 33b and 34b and the comparator 36b in a left half of FIG. 17 operate in the same manner. The content of the data of the latch in the right half represents a low level pulse width (low-level pulse width) data of the digital input signal and the content of the data of the latch in the left half represents a high-level pulse with (high-level pulse width) data of the digital input signal.

The outputs of the latches 34a and 34b are supplied to a difference circuit 91, and the output data thereof is supplied to a latch 92. The latch 92 latches periodically, and when it latches, the latches 34a and 34b are cleared and the maximum pulse width detection is resumed from that moment.

The output of the latch 92 is supplied to a pulse width difference output terminal 93.

Similarly, the output signals of the latches 34a and 34b are supplied to a summing circuit 37, an output of which is supplied to the latch 38. The latch 38 latches periodically. The output of the latch 38 is supplied to a pulse width sum output terminal 40.

The pulse width difference output terminal 93 corresponds to the output terminal of the difference circuit 63 of FIG. 16 and the pulse width sum output terminal 40 corresponds to the output terminal of the summing or averaging circuit 37 of FIG. 16.

Figure 14:
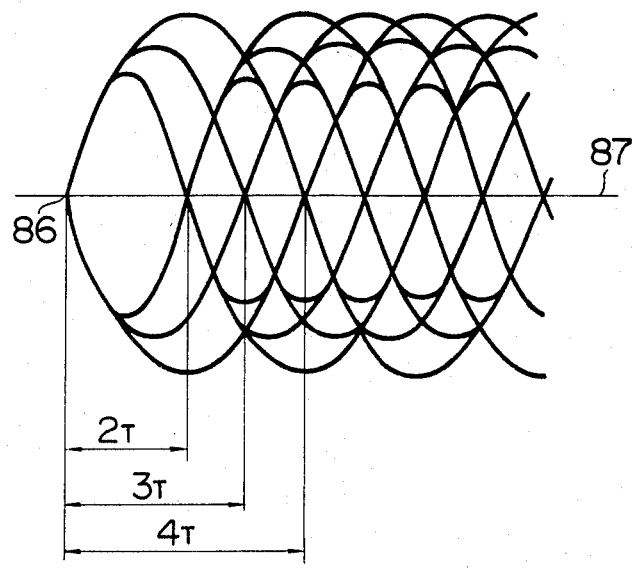
Figure 15:
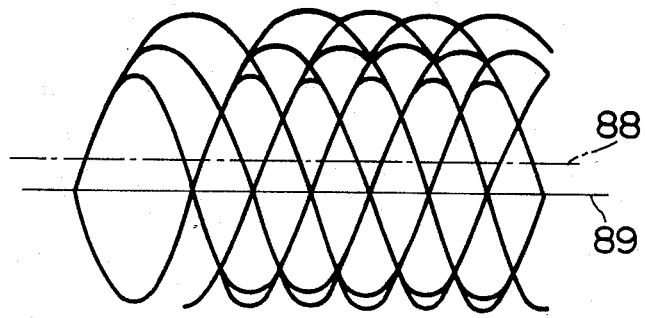

The advantage of the present embodiment is now explained with reference to eye patterns of a modified frequency modulation (MFM) signal shown in FIGS. 14 and 15. FIG. 14 shows an eye pattern of a conventional MFM data modulation system in which high-level and low-level signals of 2T, 3T and 4T are combined around a point 86. By setting a compare level of the voltage comparator to a level 87 at a crosspoint of the eye pattern, the signal can be discriminated with a minimum error rate. In FIG. 14, the error rates in the prior art system and the present invention are equal because the compare level is set to the level 87. However, if the waveform is distorted for some reason resulting in an eye pattern shown in FIG. 15, the prior art system may not correctly reproduce the input signal because the voltage is compared at a mid-point of the input waveform. That is, at a level 88 in FIG. 15. In the present invention, feedback is effected in order to reduce the difference between the high-level pulse width and the low-level pulse width. Thus, the voltage is compared at a level 89 in FIG. 15. As a result, the error rate is minimized.

As described above, it is essential that a specific pattern 11T—11T (synchronizing signal) is included in the digital signal reproduced from the disc. That is, the control is attained only within the range in which the synchronizing signal is obtained. However, when the signal source is the disc record or a tape, the sychronizing signal is not obtained in the start time of the signal medium until a steady speed is reached. Accordingly, the control of the slicing level is impossible in the above method.

The maximum pulse width detection system may be used so that the control is attained without the specific pattern such as the synchronizing signal. Since the maximum and minimum pulse widths of the input signal are usually predetermined, the maximum high-level pulse width and the minimum low-level pulse width are extracted and a difference of the pulse widths may be calculated as a duty difference to control the slicing level. In this case, however, a defect on the recording medium or noise may be detected as the maximum pulse width signal.

In the present invention, a slicing control loop is switched in accordance with the transmission rate of the input signal so that an optimum data slicing is always attained.

In accordance with the present invention, the waveform of the input signal is classified in accordance with the speed of the recording medium into (a) zero or low signal transmission rate state, (b) accelerating transmission rate state, (c) stable transmission rate state and (d) unstable signal waveform state, and an appropriate one of the slicing circuits is selected depending on the signal state.

An embodiment thereof is now explained for a signal reproducing circuit for a PCM disc. The signal transmission rate corresponds to the rotational speed of the disc. The operation is explained for the stop state of the disc, the acceleration state, the steady rotation state, and a special rotation state such as when the pickup jumps across the signal tracks to randomly access the information on the disc, which state is referred to as random access.

Figure 18:
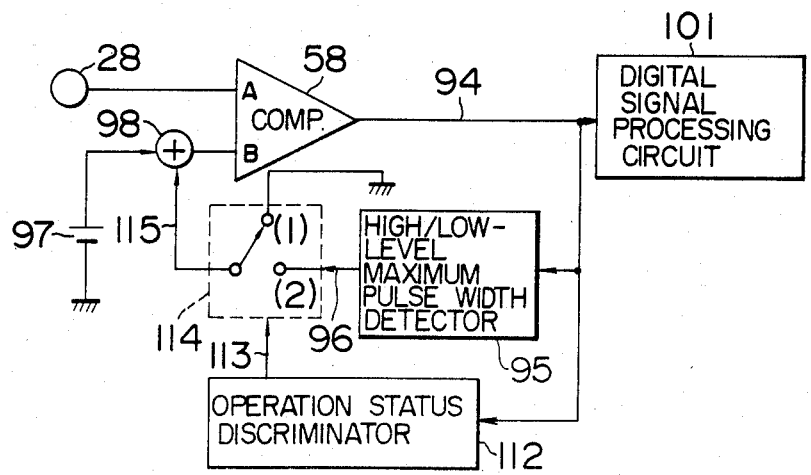
FIG. 18 shows a circuit diagram of another embodiment of the present invention.

FIG. 18 shows one embodiment of the present invention. Numeral 58 denotes a comparator, numeral 28 denotes a signal input terminal, 94 denotes an output of the comparator 58, numeral 95 denotes a high-level/low-level pulse width detector, numeral 96 denotes an output of the detector 95, numeral 97 denotes a reference voltage, numeral 98 denotes an adder, numeral 101 denotes a digital signal processing circuit, numeral 112 denotes an operation status discriminator, numeral 113 denotes an output thereof, numeral 114 denotes a switch and numeral 115 denotes an output signal therefrom.

A PCM signal reproduced from the disc is applied to the input terminal 28. The PCM signal is a modulated wave having a basic period of T and the high-level and low-level pulse widths of 3T-11T.

Signals must be extracted from the randomly supplied PCM signal to compare the high-level pulse width and the low-level pulse width. When the slicing level is not proper, the selection of the pulse signal to be compared is important.

The comparison of the maximum high-level pulse width and the maximum low-level pulse width in a given time period is equivalent to the comparison of the high-level pulse width of 11T and the low-level pulse width of 11T, from the nature of the PCM signal. This function is carried out by the high-level/low-level maximum pulse width detector 95 of FIG. 18. When the switch 114 is thrown to a position (2), the slicing level can be controlled by the maximum pulse width detector 95.

When the input signal is supplied from the medium such as the disc, the signal is not detected when the medium is started from the stop condition. Since the input pulse width at a very low speed of the medium is very long, the counter for the pulse duration detection overflows. As a result, the maximum pulse width detector may be disabled. Accordingly, it is necessary not to automatically control the slicing level but to fix the slicing level in the stop-to-start period. A position (1) of the switch 114 is provided to establish a fixed slicing level. When the switch 114 is thrown to the position (1), the output 115 of the switch 114 is "0" level so that no signal is supplied to the adder 98 and the reference voltage 97 is supplied to an input terminal B of the comparator 58.

The operation status discriminator 112 discriminates the rotation of the disc and the generation of the pulse signal, and it switches the switch 114 from the position (1) to the position (2) when proper operation of detector 95 can be achieved. In this manner, the slicing level of the signal can be smoothly controlled at the start of the disc drive.

The high-level/low-level maximum pulse width detector 95 controls the slicing level irrespectively of the signal transmission rate as described above but it may detect an erroneous maximum pulse width resulting from a defect on the disc or an external disturbance. The optimum slicing level control in the steady rotation state of the disc is now explained.

The data field of the PCM signal includes random signals but the synchronizing signal has a specific pattern and is fixed. It also appears periodically. Therefore, by detecting the high-level and low-level pulse width of the synchronizing pulse for use as the slicing level control signal, reliability is improved over the maximum pulse width detection system described above.

Figure 19:
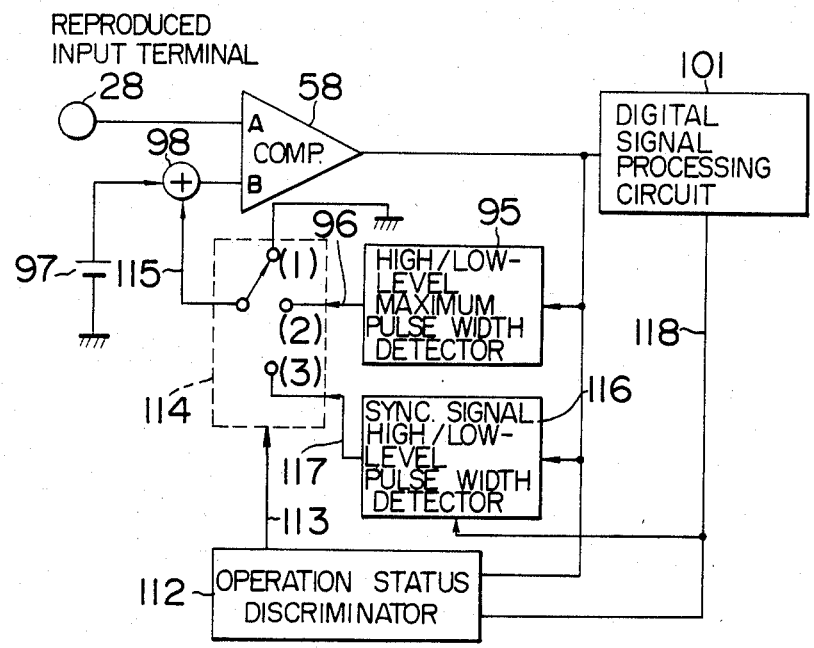
FIG. 19 shows a circuit diagram of other embodiment of the present invention.

FIG. 19 shows an embodiment thereof. Numeral 116 denotes a synchronizing signal high-level/low-level pulse width detector, numeral 117 denotes an output signal thereof and numeral 118 denotes a synchronizing signal output. The synchronizing signal high-level/low-level pulse width detector 116 is in parallel with the high-level/low-level maximum pulse width detector 95 and the output 117 thereof is supplied to a terminal (3) of the siwtch 114. The synchronizing signal 118 detected by the digital processing circuit 101 is supplied to the operation status discriminator 112 and to the synchronizing signal high-level/low-level pulse width detector 116, which produces the analog signal output 117 representing the difference between the high-level pulse width 11T and the low-level pulse width 11T of the synchronizing pulse. The detection rate of the synchronizing pulse 118 increases as the rotation of the disc approaches the steady rotation state, and it reaches substantially 100% in the steady rotation state of the disc. The operation state discriminator 112 monitors the number of times of input (detection rate) of the input synchronizing signal 118 to discriminate the normal rotation state of the disc. For example, the switch 114 is thrown to the position (3) at the synchronizing signal detection rate of 50% so that a voltage representing the difference between the high-level and low-level pulse widths detected by the synchronizing signal high-level/low-level pulse width detector 116 is supplied to the adder 7 to control the slicing level.

To summarize the flow of the above operation, the switch 114 is thrown to the position (1) from the stop state of the disc which is the signal source to the detection of the pulse duration so that the slicing level is fixed to the fixed reference voltage 97. As the disc rotates to enable the detection of the pulse width, the switch 114 is thrown to the position (2) so that the slicing level is controlled by the output signal 96 of the high-level/low level maximum pulse width detector 95. Then, as the disc rotation reaches the steady state and the synchronizing signal 118 is detected, the switch 114 is thrown to the position (3) so that the slicing level is controlled by the output signal 117 of the synchronizing signal pulse width detector 116.

An embodiment which has a hold circuit in addition to the circuit of the previous embodiment is next explained. The purpose of the hold circuit is to prevent the disturbance of the slicing level control due to an abnormal change of the pulse width during the steady rotation state of the disc by some disturbance in the signal. For example, such an abnormal change occurs when a signal level is significantly lowered by a big defect on the disc or the pickup jumps across the signal tracks to randomly access the information on the disc.

Figure 20:
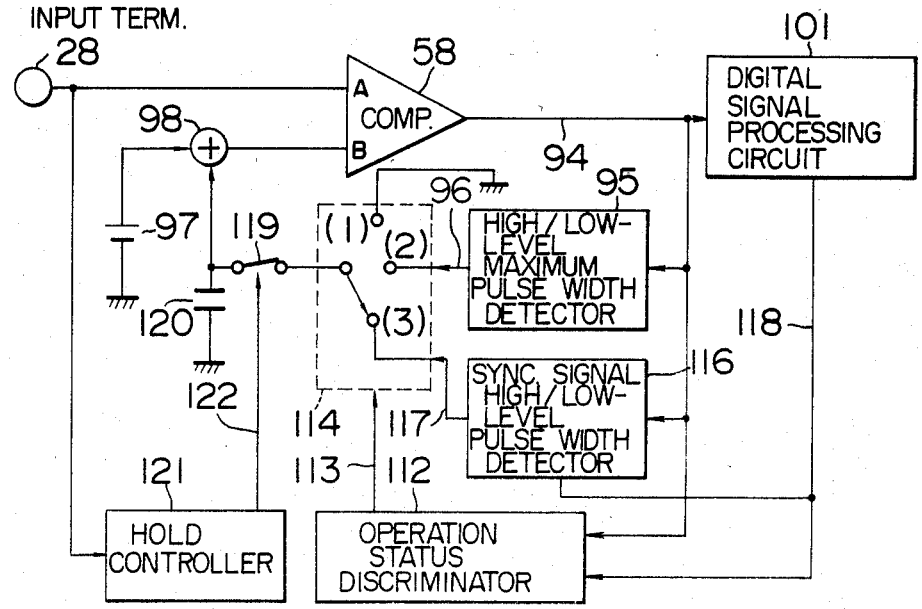
FIG. 20 shows a circuit diagram of a further embodiment of the present invention.

FIG. 20 shows an embodiment which includes such a hold circuit. Numeral 119 denotes a switch, numeral 120 denotes a capacitor, numeral 121 denotes a hold controller and numeral 122 denotes an output signal thereof.

The switch 119 is normally on. The slicing level control voltage from the switch 114 is charged in the capacitor 120. When the signal amplitude at the input level 28 reduces, the hold controller 121 turns off the switch 119. The capacitor 120 holds the voltage stored therein immediately before the turn-off of the switch 119 to maintain the slicing level constant. In this manner the variation of the slicing level is prevented. When the disturbance of the input signal from the terminal 28 is foreseen such as by random access, a signal may be sent to the hold controller 121 prior to the operation to maintain the slicing level.

The hold circuit in the present embodiment holds the analog signal by means of the capacitor 120. The hold circuit may be constructed to block a latch clock signal in a digital data latch of the pulse width detector.

Figure 21:
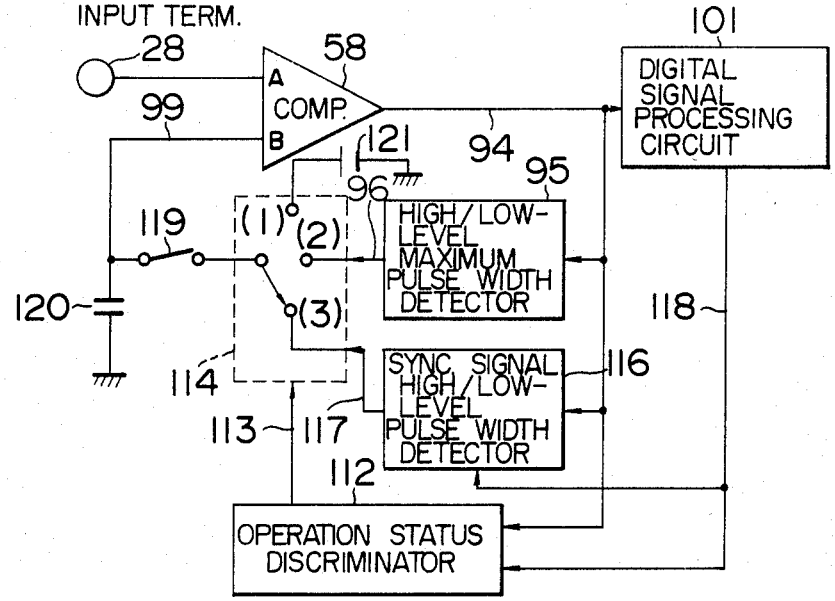
FIG. 21 shows a circuit diagram of a still further embodiment of the present invention.

An embodiment shown in FIG. 21 omits the reference voltage 98 and the adder 97 of the previous embodiment. A voltage corresponding to the reference voltage 97 is included in the pulse width detectors 95 and 116. The slicing level is controlled in a similar manner. A voltage 121 applied to the terminal (1) of the switch 114 is a fixed voltage corresponding to the reference voltage 97.

While the basic operation of the present embodiment has been explained by the block diagrams, the circuits of the respective blocks are next explained in detail.

Figure 22:
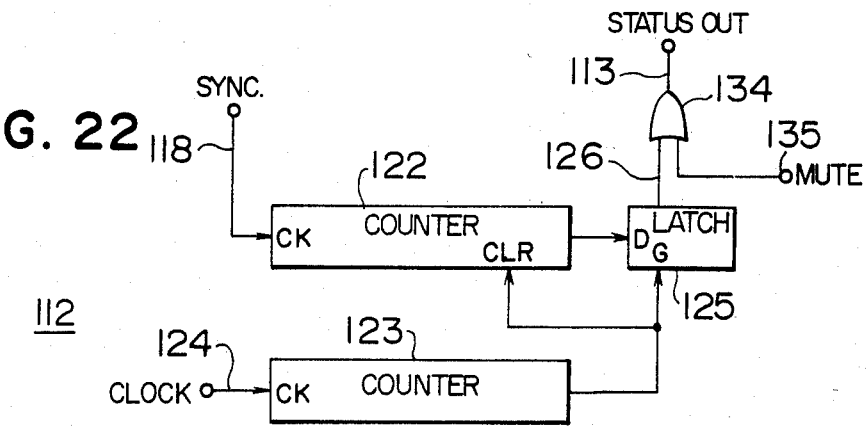
FIG. 22 shows a circuit diagram of an embodiment of an operation status discriminator.

An embodiment of the operation status discriminator 112 is first explained. FIG. 22 shows a circuit which counts the number of times of receipt of input of the synchronizing signal 118 to discriminate whether the disc is in the normal rotating state. Numeral 122 denotes a counter which counts the synchronizing signal 118, numeral 123 denotes a counter which frequency-divides a clock 124, numeral 125 denotes a latch and numeral 126 denotes an output thereof. When the counter 122 counts a predetermined number of synchronizing signals 118, it sends the output signal to a data input terminal of the latch 125. The predetermined number may be a number corresponding to the synchronizing signal detection rate of 50%. The counter 123 frequency-divides (counts) the clock 124 to establish a reference time to the synchronizing signal counting. The output of the counter 123 is supplied to the latch 125 as a latch signal so that the latch 125 latches the data input. The output 126 of the latch 125 is supplied to an OR gate 134, an output 113 of which is taken out as the output of the operation status discriminator 112 to discriminate whether the disc is in the normal rotation state. Numeral 135 denotes a muting signal of the reproduced signal. When the muting is released, the normal rotation state of the disc is discriminated through the OR gate 134.

Figure 23:
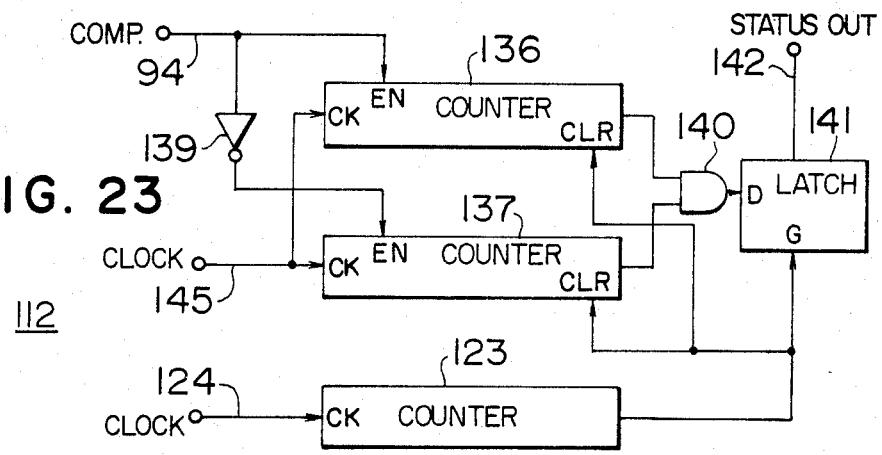
FIG. 23 shows a circuit diagram of another embodiment of the discriminator.

FIG. 23 shows an embodiment of the operation status discriminator 112 which discriminates the start of rotation of the disc. Numerals 136 and 137 denote counters for measuring the pulse width of the output 94 of the comparator. The counter 136 measures the high-level pulse width of the comparator output 94 and the counter 137 measures the low-level pulse width of the comparator output 94 supplied through an inverter 139. When the counts of the counters 136 and 137 reach a count corresponding to a predetermined pulse width, they supply the outputs to an AND gate 140. When both the high-level pulse width and the low-level pulse width reach the predetermined pulse width, the AND gate 140 supplies the output to a data terminal of a latch 141. The counter 123 and the clock 124 generate a reference time as is done in FIG. 22 and the output of the counter 123 is supplied to a latch terminal of the latch 141 to latch the data input signal applied thereto. A latch output signal 142 is taken out as the output of the operation status discriminator, which indicates the start of the disc rotation. Numeral 145 denotes a clock signal for measuring the pulse width.

Figure 24:
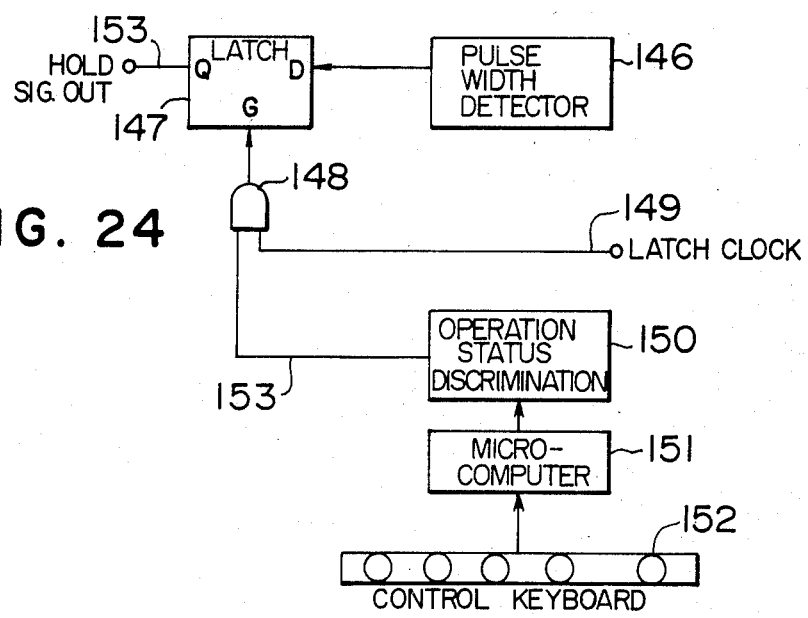
FIG. 24 shows a specific circuit diagram of the discriminator and a hold control circuit.

FIG. 24 shows an embodiment of the operation status discriminator 112 and the hold controller 121. The operation in the random access mode of the disc is explained here. An output signal of a pulse width detector 146 is supplied to an output terminal 153 through a latch 147. The latch 147 is controlled by a latch signal 149 through an AND gate 148. Numeral 152 denotes a control keyboard which is an input portion for the random access for selecting the information on the disc. The output signal of the keyboard 152 is supplied to a microcomputer 151 which sends a signal to an operation status discriminator 150. The operation status discriminator 150 predicts that the detection signal of the disc will be disturbed by the random access and produces a hold signal 153. Thus, the hold signal 153 assumes a low level to block the latch signal 149 by the AND gate 148. As a result, the output 153 of the latch 147 maintains the previous data. In this manner, the reference voltage of the comparator is not disturbed by the disturbance of the reproduced signal of the disc such as by the random access and stable operation is maintained.

Figure 25:
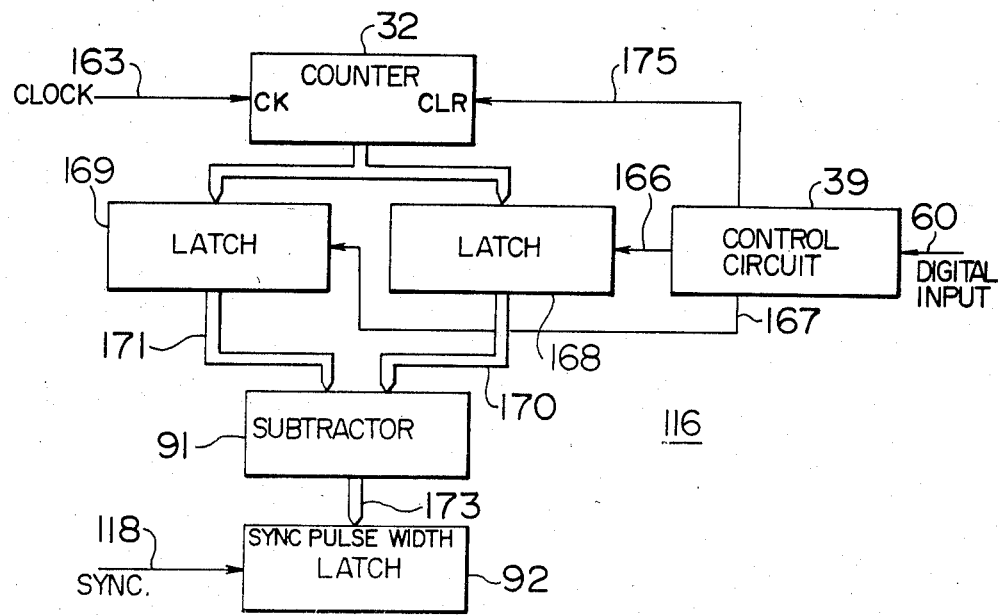
FIG. 25 shows a circuit diagram of a synchronizing signal pulse width detector.

FIG. 25 shows an embodiment of the synchronizing signal pulse width detector 116 which is shown in FIG. 17. Thus, FIG. 25 is extracted from FIG. 17. Numeral 163 denotes a clock signal, numeral 32 denotes a counter, numeral 39 denotes a control circuit, numerals 166 and 167 denote edge signals, numerals 168 and 169 denote latches, numerals 170 and 171 denotes output data of the latches, numeral 91 denotes a subtractor, numeral 173 denotes an output thereof, numeral 92 denotes a latch and numeral 175 denotes a clear signal.

Figure 26:
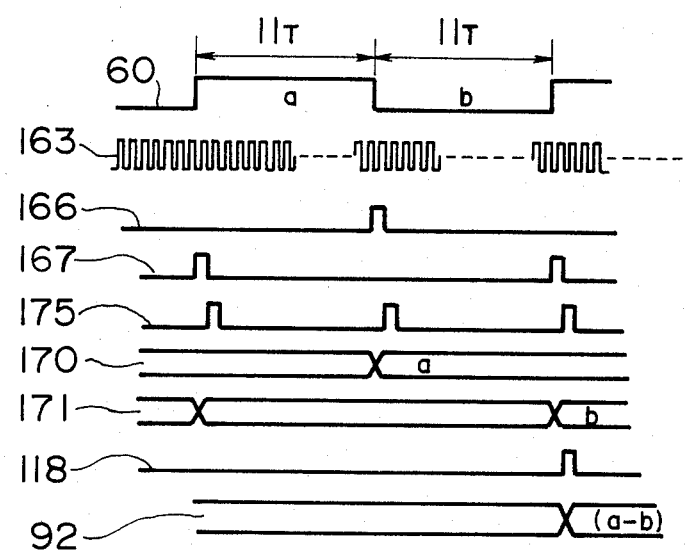
FIG. 26 shows a time chart.

The operation of the present embodiment is now explained with reference to FIG. 25 and a time chart of FIG. 26. It is assumed that the input signal 60 of FIG. 25 is a synchronizing signal of 11T—11T.

In FIG. 25, numeral 163 denotes the counter clock for measuring the pulse width, which has a period equal to ⅛ of a basic period T, numeral 39 denotes the control circuit, numeral 166 and 167 denote the output signals thereof for a negative-going edge and a positive-going edge, respectively, of the input signal 60, numeral 175 denotes the clear signal which is a shifted version of the edge signals, for clearing the counter 32, numeral 168 denotes a latch which latches the high-level pulse width by the edge signal 166. The data a thereof corresponds to a count of 88 when the input signal 60 is correct. Numeral 169 denotes a latch which latches the low-level pulse width by the edge signal 167. The data b thereof also corresponds to a count of 88 when the input signal 60 is correct. Numeral 118 denotes the synchronizing signal output of the digital processing circuit which contains the synchronizing signal detector. By latching the output of the subtractor 91 to which the data a and the data b are applied in timed relation with the synchronizing signal output 118, the latch 92 produces a difference signal (a−b).

The output data (difference signal a−b) represents time information which must be converted to an analog signal in order to control the slicing level of the comparator 58 shown in FIGS. 20 and 21. Thus, the digital information of the latch 92 is converted to a PWM signal which is then filtered by a CR filter to produce the analog signal.

Figure 27:
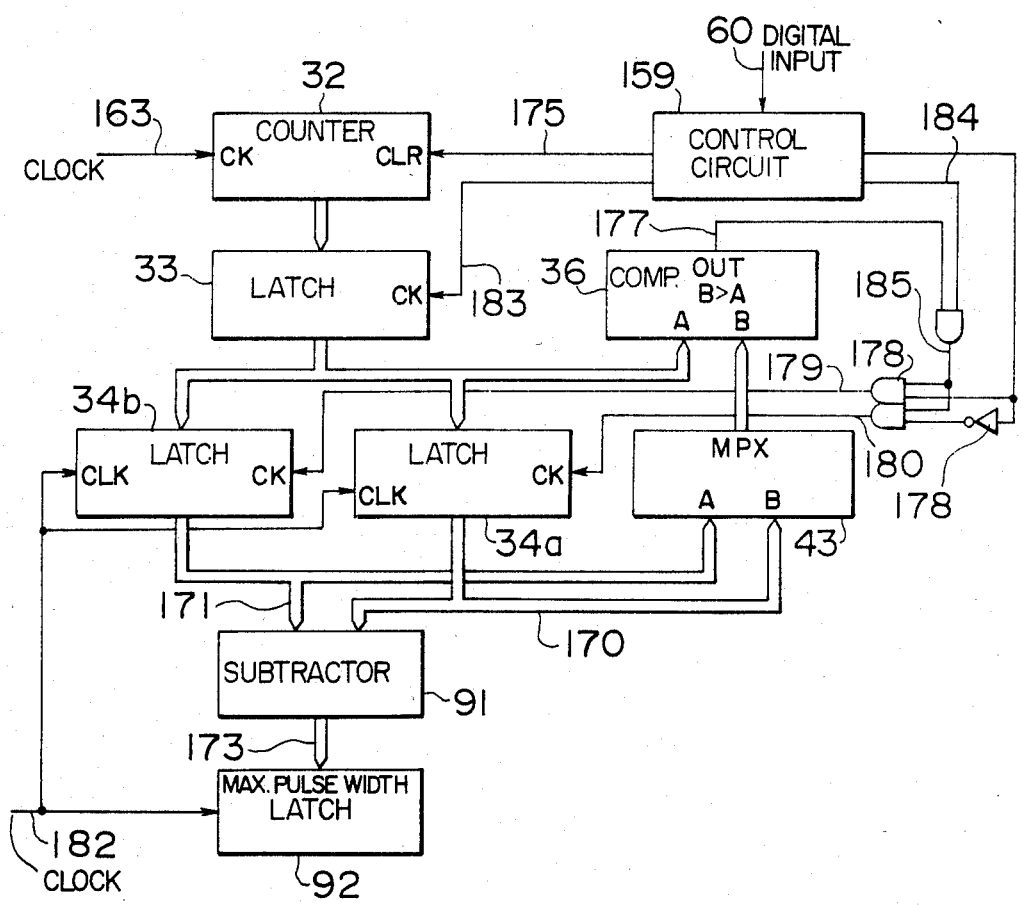
FIG. 27 shows a circuit diagram of a maximum pulse width detector.
Figure 28:
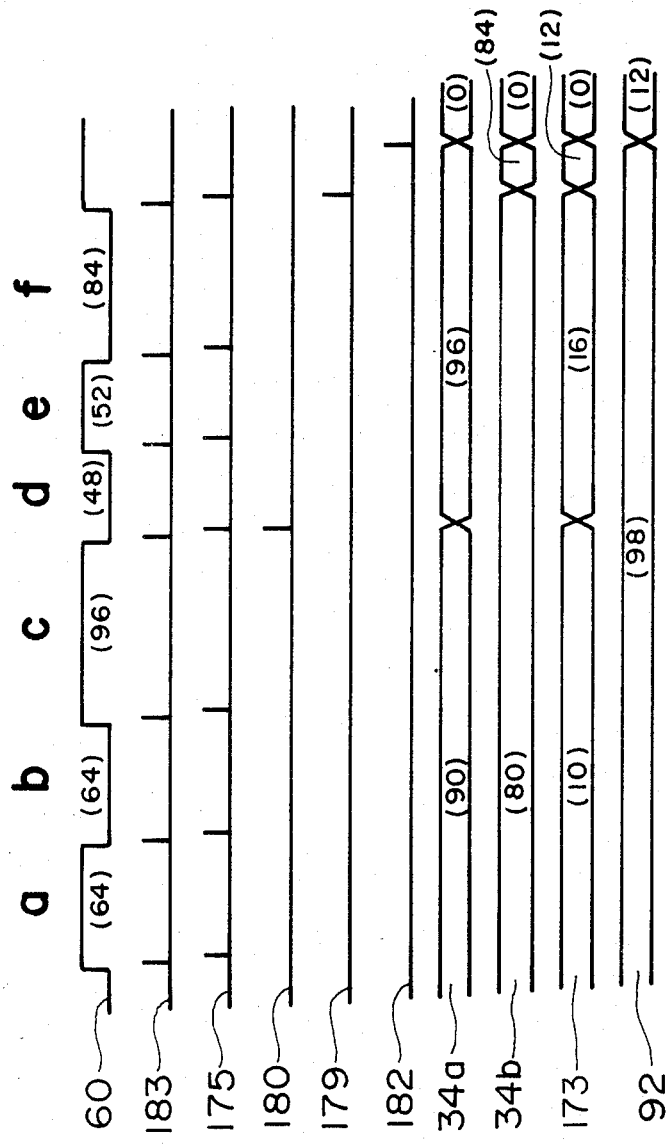
FIG. 28 shows a time chart.

An embodiment of the maximum pulse width detector is now explained with reference to FIGS. 27 and 28. FIG. 27 shows an application of FIG. 25. A counter 32 counts a clock 163 and the count thereof is latched in a latch 33 in timed relation with an edge signal 183 of an input signal 60. After it has been latched, the counter 32 is cleared by a clear signal 175. The data in the latch 33 corresponds to the pulse width of the input signal 60. The output of the latch 33 is supplied to an input terminal A of a comparator 36 which compares it with a signal supplied to an input terminal B which is an output signal of a multiplexer 43, which selects the data of a high-level pulse width latch 34a or a low-level pulse width latch 34b. If the pulse width latched in the latch 33 is the data C shown in FIG. 28 which is a high-level pulse, the multiplexer 43 selects the data B. The comparator 36 produces a high level voltage output 177 when the input data is A>B.

Assuming that the content of the data C of the input signal 60 is a count of 96 and the output data of the latch 34a is a count of 90, the output 177 assumes the high level because 96>90, and a clock signal 180 is supplied to a latch 34a through gates 178 by a clock signal 184 so that the content of the latch 34a is changed from 90 to 96. Thus, when the current data is larger than the previous data, the content of the latch 34a is changed. In this manner, a maximum value is held. A latch 34b similarly holds a maximum low-level pulse width. The outputs of the latches 34a and 34b are supplied to a subtractor 91, an output 173 of which is supplied to a latch 92. A clock signal 182 to the latch 92 is periodically generated. When the clock signal 182 is generated, the latch 92 latches the output 173 of the subtractor 91. Then, the latches 34a and 34b are cleared and the latches 34a and 34b resume the maximum pulse width detection.

Thus, the difference between the maximum high-level pulse width and the maximum low-level pulse width is latched in the latch 92 at the frequency of the clock signal 182. In the time chart shown in FIG. 28, the latch 92 finally latches the data "12" (=96−84).

The embodiment of the maximum high-level and low-level pulse width detector has thus been described. The output data is converted to an analog signal in the same manner as described above.

Figure 29:
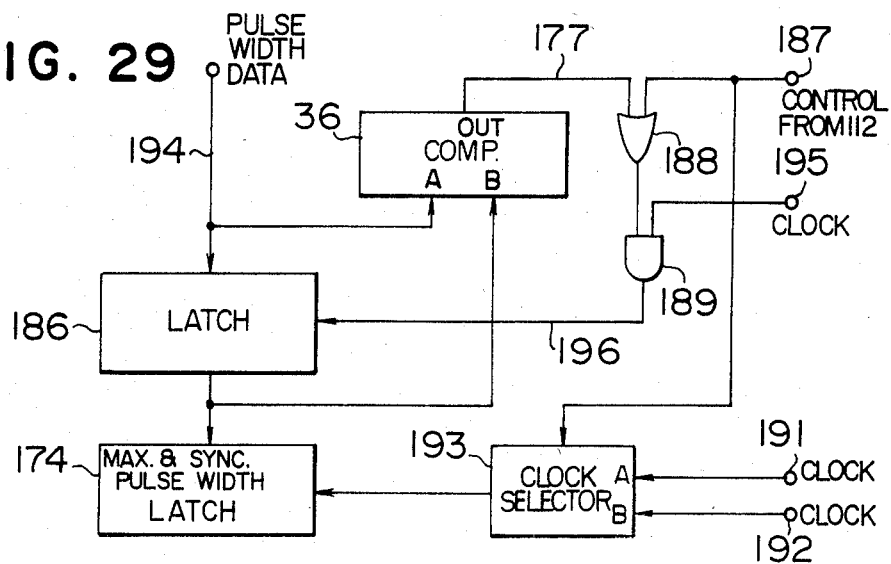
FIG. 29 shows a common circuit diagram for the synchronizing signal pulse width detector and the maximum pulse width detector.

An embodiment of the present invention which combines the synchronizing signal high-level and low-level pulse width detector 116 and the maximum high-level and low-level pulse width detector 95 described above is now explained. FIG. 29 shows the principle thereof. Numeral 36 denotes a comparator, numeral 177 denotes an output thereof, numerals 186 and 174 denote latches, numerals 195, 191 and 192 denote clocks, numeral 187 denotes a control line, numeral 188 denotes an OR gate, numeral 189 denotes an AND gate, numeral 193 denotes a clock selector and numeral 194 denotes pulse width data.

The latch 186 latches a maximum value of the pulse width data 194. To this end, the input and output signals of the latch 186 are applied to the comparator 36. The output 177 of the comparator 36 is supplied to a latch drive clock input terminal of the latch 186 through the OR gate 188 and the AND gate 189. The latch 174 latches the data of the latch 186 at a predetermined interval. The latch 174 is activated by the clock 191 or 192 through the clock selector 193. If the signal on the control line 187 from the operation status discriminator 112 is at a low level, the OR gate 188 opens and the clock selector 193 selects the clock 191 for detecting the maximum pulse width. Under this condition, the maximum value of the pulse width data 194 is latched in the latch 186 by the clock 196 in accordance with the output 177 of the comparator 36. Then, it is latched in the latch 174 by the clock 191. When the signal on the control line 187 is at a high level, the output of the OR gate 188 is at high level and the latch 186 latches the data by the clock 196 irrespective of the magnitude of the pulse width. The output of the clock selector 193 is switched to the clock 192 so that the latch 174 latches the output data of the latch 186 by the clock 192. If the clock 192 is identical to the synchronizing signal of the PCM signal, the data latched in the latch 174 includes only the pulse width data of the synchronizing signal derived from the pulse width data 194 through the latch 186. In this manner, the maximum pulse width is latched in the latch 174 when the signal on the control line 187 is at low level, and the synchronizing signal pulse width is latched in the latch 174 when the signal on the control line 187 is at high level.

Figure 30:
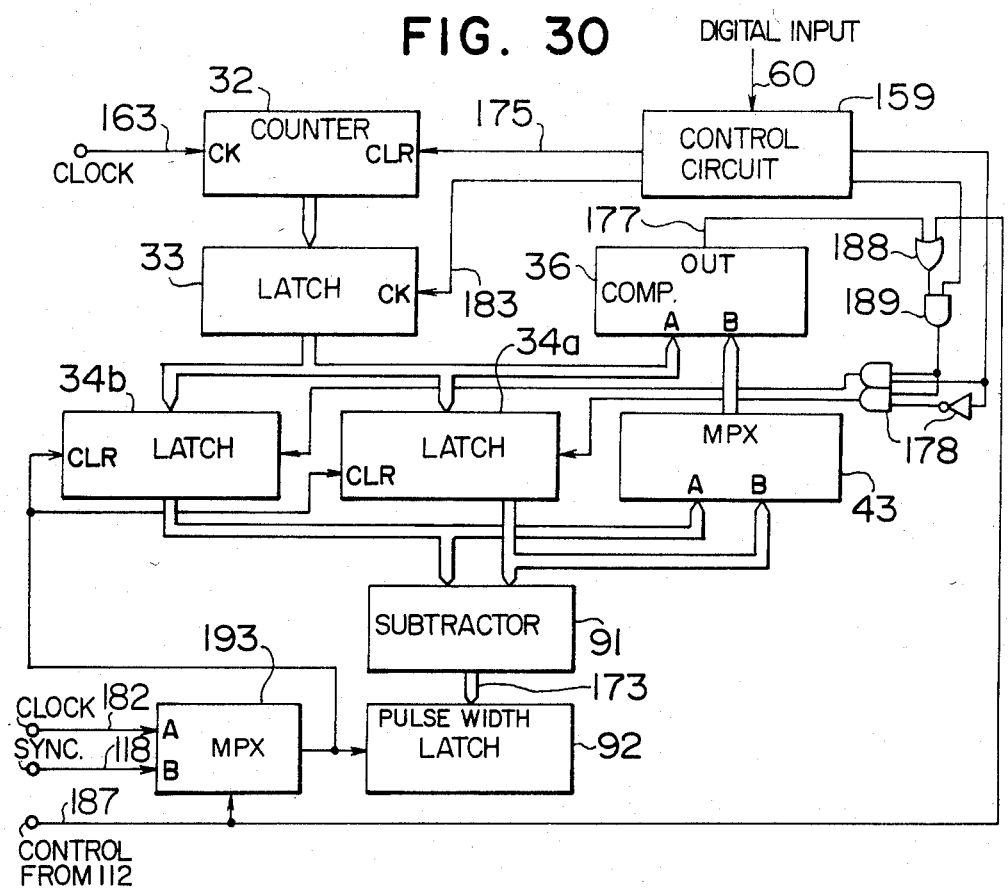
FIG. 30 shows a specific circuit diagram thereof.

FIG. 30 shows a specific circuit of the block diagram shown in FIG. 29. It combines the circuit of FIG. 25 and the circuit of FIG. 27. Basically, two channels of high-level and low-level pulse latches and a subtractor are additionally provided. A detailed description of the present embodiment is omitted. The two pulse width detectors may be combined and selected by the control line 187 as described above.

In accordance with the present invention, the transmission rate status of the input signal, that is, stop status, acceleration status or steady status is discriminated and an optimum control system is selected in accordance with the discriminated status. Accordingly, a stable slicing level is obtained in any input signal condition. For a temporary disturbance of the input signal, the slicing level is held to stabilize the operation. By sharing the pulse width detector, the circuit can be simplified.

We claim:

1. A control circuit for a digital player comprising:
    comparator means for comparing an input signal of a digital signal sequence reproduced from a recording medium with a predetermined reference voltage;
    a signal processing circuit for processing an output signal of said comparator means to reproduce an original signal;
    a switch;
    a fixed voltage source connected to said switch;
    at least one voltage generator connected to said switch, including a high-level pulse width detector for detecting the pulse width in a high-level range in which the input signal to said comparator means is larger than said predetermined reference voltage, a low-level pulse width detector for detecting the pulse width in a low-level range in which the input signal to said comparator means is smaller than said predetermined reference voltage and an arithmetic operation circuit for calculating the difference between the output of said high-level pulse width detector and the output of said low-level pulse width detector; and
    an operation status discriminator for discriminating the operation status of said digital player;
    the output of said switch being applied to a reference terminal of said comparator means, said switch being controlled by the output of said operation status discriminator to switch said predetermined reference voltage of said comparator means.

2. A digital player according to claim 1 wherein said high-level pulse width detector and said low-level pulse width detector each detects a maximum or minimum pulse width within a predetermined time period.

3. A digital player according to claim 1 further comprising a voltage hold circuit for holding said reference voltage of said comparator by said operation status discriminator.

4. A digital player according to claim 1 wherein said operation status discriminator discriminates whether a maximum or minimum pulse width within a predetermined time period is within a predetermined width or not and connects said switch to said fixed voltage generator if above said predetermined width and connects said switch to said voltage generator if within said predetermined width.

5. A digital player according to claim 1 wherein said voltage hold circuit is controlled by an output signal of an input signal magnitude detector.

6. Digital player for reproducing a digital signal sequence including an information signal and a synchronizing signal having a specific pattern, comprising: a recording medium driven by a drive motor; a sensor for picking up a signal from the recording medium; a voltage comparator having a first input connected to receive the output of said sensor and a second input; a digital signal processing circuit connected to said voltage comparator for deriving an analog signal from the digital signal sequence outputted from the comparator; a first pulse width detector connected to the output of said voltage comparator for detecting a maximum high-level pulse width in said digital signal sequence; a second pulse width detector connected to the output of said voltage comparator for detecting a maximum low-level pulse width of said digital signal sequence; a difference circuit connected to receive the outputs of said first and second detectors for producing digital pulse width data representing the difference between the output data of said first and second detectors; and a digital-to-analog converter connected to the output of said difference circuit, said second input of said voltage comparator being connected to the output of said digital-to-analog converter, whereby the output of said digital-to-analog converter operates to control the threshold level for said signal picked up by the sensor to equalize the high-level pulse width and the low-level pulse width of said digital signal sequence produced at the output of said voltage comparator.

7. The digital player according to claim 6, further including a summing/averaging circuit connected to receive the outputs of said first and second detectors, and a motor drive circuit connected to receive the output of said summing/averaging circuit for applying a control signal to the drive motor to control the rotational speed thereof.

8. The digital player according to claim 6, further including an adder having first and second inputs and an output which is connected to said second input of said voltage comparator, a fixed voltage source connected to said first input of said adder, and first switch means for selectively connecting the output of said digital-to-analog converter to said second input of said adder.

9. The digital player according to claim 8, further including operation status discriminator means responsive to the output of said voltage comparator for controlling said first switch means to effect the connection of said digital-to-analog converter to said adder only when said recording medium is being driven at a speed greater than a predetermined speed.

10. The digital player according to claim 9, further including a summing/averaging circuit connected to receive the outputs of said first and second detectors, and a motor drive circuit connected to receive the output of said summing/averaging circuit for applying a control signal to the drive motor to control the rotational speed thereof.

11. The digital player according to claim 8, further including a voltage hold circuit connected to said second input of said adder and second switch means for selectively connecting said first switch means to said second input of said adder.

12. The digital player according to claim 11, wherein aid second switch means includes hold controller means responsive to the output of said sensor for disconnecting said first switch means from said adder when the output of said sensor falls below a predetermined magnitude.

13. The digital player according to claim 9, wherein said digital signal processing circuit includes means for detecting said synchronizing signal in the digital signal sequence outputted from said voltage comparator; and further including a third pulse width detector connected to receive said detected synchronizing signal for detecting the maximum high-level pulse width thereof; a fourth pulse width detector connected to receive said detected synchronizing signal for detecting the maximum low-level pulse width thereof; a further difference circuit connected to receive the outputs of said third and fourth pulse width detectors; a latch circuit connected to said further difference circuit and responsive to said detected synchronizing signal for latching the output of said further difference circuit; and a further digital-to-analog converter connected between said latch circuit and said first switch means; said operation status discriminator means including means responsive to said detected synchronizing signal for controlling said first switch means to effect connection of said further digital-to-analog converter to said adder in lieu of said first-mentioned digital-to-analog converter when the detected rate of said synchronizing signal reaches a predetermined value.

14. The digital player according to claim 13, further including a voltage hold circuit connected to said second input of said adder and second switch means for selectively connecting said first switch means to said second input of said adder.

15. The digital player according to claim 14, wherein said second switch means includes hold controller means responsive to the output of said sensor for disconnecting said first switch means from said adder when the output of said sensor falls below a predetermined magnitude.

16. Digital player for reproducing a digital signal sequence including an information signal and a synchronizing signal having a specific pattern, comprising: a recording medium driven by a drive motor; a sensor for picking up a signal from the recording medium; a voltage comparator having a first input connected to receive the output of said sensor and a second input; a digital signal processing circuit connected to the output of said voltage comparator for deriving an analog signal corresponding to said information signal as well as the synchroniziong signal from said digital signal sequence; high/low level maximum pulse width detector means connected to the output of said voltage comparator for producing a first signal which represents the difference between detected maximum high and low level pulse widths in said digital signal sequence; synchronizing signal high/low level pulse width detector means connected to the output of said voltage comparator and to said digital signal processing circuit for producing a second signal which represents the difference between the high and low level pulse widths of said synchronizing signal; and adder having first and second inputs and an output which is connected to said second input of said voltage comparator; a fixed voltage source connected to said first input of said adder; and first switch means for selectively connecting said second input of said adder to ground potential, to the output of said high/low level maximum pulse width detector means or to be output of said synchronizing signal high/low level pulse width detector means.

17. Digital player according to claim 16, further including operation status discriminator means connected to the output of said voltage comparator and to said digital signal processing circuit for controlling said first switch means in response to said digital signal sequence and said synchronizing signal to connect said second input of said adder to ground potential when the speed of the recording medium is below a predetermined value, to the output of said high/low level maximum pulse width detector means when the speed of the recording medium exceeds said predetermined value, and to the output of said synchronizing signal high/low level pulse width detector means when the detection rate of said synchronizing signal reaches a predetermined value.

18. Thd digital player according to claim 17, further including a voltage hold circuit connected to said second input of said adder and second switch means for selectively connecting said first switch means to said second input of said adder.

19. The digital player according to claim 18, wherein said second switch means includes hold controller means responsive to the output of said sensor for disconnecting said first switch means from said adder when the output of said sensor falls below a predetermined magnitude.

20. Digital player for reproducing a digital signal sequence including an information signal and a synchronizing signal having a specific pattern, comprising: a recording medium driven by a drive motor; a sensor for picking up a signal from the recording medium; a voltage comparator having a first input connected to receive the output of said sensor and a second input; a digital signal processing circuit connected to the output of said voltage comparator for deriving an analog signal corresponding to said information signal as well as the synchroniziong signal from said digital signal sequence; pulse width detection means connected to the output of said voltage comparator means for detecting the pulse width of each high and low level of said digital signal sequence; first latch means for selectively storing the pulse width data detected by said pulse width detection means; comparison means responsive to the pulse width data provided by said pulse width detection means and the data stored in said first latch means for controlling said first latch means to store received pulse width data when it represents a value greater than the value of the pulse width data already stored therein; operation status discriminator means connected to the output of said voltage comparator and said digital signal processing circuit for applying a control signal to operate said first latch means to store all pulse width data received from said pulse width detection means regardless of the output of said comparison means when the detection rate of said synchronizing signal reaches a predetermined value; difference means connected to said first latch means for producing an output which indicates the difference between successive high and low level pulse widths of the digital signal sequence obtained from said first latch means; second latch means for storing the output of said difference means in response to receipt of a clock signal; clock signal selection means responsive to said control signal of said operation status discriminator means for applying a first clock signal having a selected low frequency to said second latch means and for applying a second clock signal having the higher frequency of said synchronizing signal to said second latch means upon receipt of a control signal; an adder having first and second inputs and an output which is connected to said second input of said voltage comparator; a fixed voltage source connected to said first input of said adder; and first switch means for selectively connecting said second input of said adder to ground potential or to the output of said second latch means.

21. Digital player according to claim 20, wherein said operation status discriminator means includes means for controlling said first switch means in response to said digital signal sequence to connect said second input of said adder to ground potential when the speed of the recording medium is below a predetermined value and to the output of said second latch means when said speed exceeds said predetermined value.

22. The digital player according to claim 21, further including a voltage hold circuit connected to said second input of said adder and second switch means for selectively connecting said first switch means to said second input of said adder.

23. The digital player according to claim 22, wherein said second switch means includes hold controller means responsive to the output of said sensor for disconnecting said first switch means from said adder when the output of said sensor falls below a predetermined magnitude.

24. Digital player according to claim 20, wherein said first latch means includes a high level latch and a low level latch for storing the pulse width data for successive pulses in said digital signal sequence and said difference means includes a subtractor for subtracting the values stored in said high and low level latches.

25. Digital player according to claim 24, further including a summing/averaging circuit connected to said first latch means for averaging the contents of said high and low level latches and a motor drive circuit connected to receive the output of said summing/averaging circuit for applying a signal to said drive motor to control the rotational speed thereof.

* * * * *